United States Patent [19]

Schoofs

[11] Patent Number: 4,642,674

[45] Date of Patent: Feb. 10, 1987

[54] FIELD EFFECT SEMICONDUCTOR DEVICE HAVING IMPROVED VOLTAGE BREAKDOWN CHARACTERISTICS

[75] Inventor: Franciscus A. C. M. Schoofs, Eindhoven, Netherlands

[73] Assignee: U.S. Philips Corporation, New York, N.Y.

[21] Appl. No.: 854,064

[22] Filed: Apr. 17, 1986

Related U.S. Application Data

[63] Continuation of Ser. No. 618,632, Jun. 8, 1984.

[30] Foreign Application Priority Data

Jun. 13, 1983 [NL] Netherlands ................. 8302092

[51] Int. Cl.⁴ ............... H01L 29/78; H01L 29/90; H01L 27/02; H01L 29/40
[52] U.S. Cl. ................ 357/23.8; 357/23.4; 357/41; 357/53; 357/13
[58] Field of Search ............ 357/23.8, 23.4, 41, 357/53, 13

[56] References Cited

U.S. PATENT DOCUMENTS

| | | | |
|---|---|---|---|
| 4,300,150 | 11/1981 | Colak | 357/23.8 |
| 4,422,089 | 12/1983 | Vaes et al. | 357/13 |
| 4,485,392 | 11/1984 | Singer | 357/13 |
| 4,543,596 | 9/1985 | Strack et al. | 357/23.4 |
| 4,561,003 | 12/1985 | Tihanyi et al. | 357/23.4 |

FOREIGN PATENT DOCUMENTS

| | | | |
|---|---|---|---|
| 0057256 | 8/1982 | European Pat. Off. | 357/23.4 |
| 2087648 | 5/1982 | United Kingdom | 357/23.4 |

OTHER PUBLICATIONS

Leipold et al. "SIPMOS FET . . . " *Proceed. of the Journees d'Electronique et de Microtechnique*: 1980 on the subject Limits To Miniaturization, Lausanne, Switzerland Oct. 7-9, 1980 pp. C51-C58.

Primary Examiner—Martin H. Edlow
Assistant Examiner—Jerome Jackson
Attorney, Agent, or Firm—Robert T. Mayer; Steven R. Biren

[57] ABSTRACT

A semiconductor device including a field effect transistor of the D-MOS type which is composed of substructures and in which further surface zones are provided in the intermediate spaced between the regularly arranged substructures in order to improve the field distribution in the semiconductor body, as a result of which the breakdown voltage of the transistor is increased. The further surface zones can be provided without additional processing steps being required and need not be contacted at the main surface.

11 Claims, 3 Drawing Figures

FIELD EFFECT SEMICONDUCTOR DEVICE HAVING IMPROVED VOLTAGE BREAKDOWN CHARACTERISTICS

This is a continuation of application Ser. No. 618,632, filed June 8, 1984, now abandoned.

BACKGROUND OF THE INVENTION

The invention relates to a semiconductor device comprising a semiconductor body having a major surface which is adjoined by a comparatively weakly-doped semiconductor region of a first conductivity type, in which the major surface is adjoined by several first zones of a second conductivity type opposite to the first conductivity type which are arranged at regular distances from each other and extend from the major surface down to a smaller depth in the semiconductor body than the semiconductor region. Inside each of these first zones is a comparatively highly-doped second zone of the first conductivity type which is separated in the semiconductor body by the first zone from the semiconductor region, each first zone having a first outer edge and each second zone having a second outer edge, the second outer edge, viewed on the major surface, being located inside the first outer edge and the first and the second outer edge having a substantially equal relative distance substantially throughout their lengths. Each second zone is connected to the adjoining first zone and the first zones are separated at the major surface from each other by a substantially symmetrical grid-shaped part of the semiconductor region which surrounds each of the first zones, this grid-shaped part being covered at the major surface with an insulating layer which extends beyond the first outer edge and at least as far as the second outer edge. On the insulating layer, a conductive layer is present which serves as a gate electrode and covers at least part of the major surface occupied by the grid-shaped part, this conductive layer having openings whose size corresponds to the lateral extent of the first zones located beneath these openings in the semiconductor body.

Such semiconductor devices comprising an insulated gate field effect transistor are known inter alia from British Patent Application GB No. 2087648. In general, the transistor is a power transistor, transistor structures of this kind being also designated as, for example, TRIMOS, HEXFET or SIPMOS. They can be manufactured by means of a technique referred to in the literature as the D-MOS technique.

The first zones generally have the form of a regular polygon and are arranged at equal distances from each other. The semiconductor region constitutes a common drain zone and the second zones constitute source zones, which may be connected to each other by means of a conductive layer. Generally, the second zones have a closed configuration, while the first zone extends as far as the major surface in the central part of the regular polygon and inside the closed configuration of the second zone. The conductive layer, which constitutes the electrical connection of the source zone and hence of the second zone, is then also directly connected to the first zone at the center of the polygon. The first and second outer edges define the actual channel region which adjoins the major surface and in which, at least when the transistor is operated in the conductive condition, a channel controlled by the gate electrode is present between the source zone and the semiconductor region.

It is often desirable that these field effect transistors have a low resistance in the conductive condition. This leads to the use of the described polygonal substructures, in which the goal is a favorable ratio of the channel width to the required semiconductor surface area. Sometimes more complicated topographic forms than the polygons are used. For example, it has already been suggested that the channel region should not follow the complete circumference of a polygon, but that the channel region should be locally bent inwards and then should be returned to the circumference. The channel region then has a meandering form, in which nevertheless the substructure occupies the area of a regular polygon.

For the said series resistance, besides the channel width, the relative distance between the substructures is also of importance. The curent flowing through the transistor has to flow via the intermediate grid-shaped part to the electrical connection of the drain region. This connection may be provided on the side of the semiconductor body located opposite to the major surface if, for example, a single transistor is concerned. Mostly, the comparatively weakly-doped semiconductor region will then be a semiconductor layer which extends on a comparatively highly-doped substrate of the one conductivity type. However, the transistor may also form part of an integrated circuit, in which event the comparatively weakly-doped semiconductor region of the first conductivity type is constituted by an island which at least during operation of the circuit is isolated from the remaining part of the semiconductor body. In this case, the relevant island will be provided with the comparatively highly-doped buried layer of the first conductivity type, and a conducting contact connected to the island may be present at the major surface, for example at the edge of the transistor structure. This conducting contact constitutes, together with the buried layer, the electrical connection of the drain zone. The mutual distance between the substructures influences the spreading resistance in the comparatively weakly-doped semiconductor region, which is met by the current flowing through the transistor between the channel located at the main surface and the highly doped substrate or the highly-doped bured layer. This means in practice that a lower limit is given for the distance between the first outer edges of adjacent first zones.

Besides the serious resistance, the permissible operating voltage is of importance for power transistors. This voltage is mainly determined by the break-down voltage of the pn junctions between the first zones and the adjoining comparatively weakly-doped semiconductor region. In connection herewith it is of importance that these pn junctions are mostly curved in the proximity of the first outer edges of the first zones. It has also to be avoided that the pn junctions can break down at the major surface. It is usual to choose the distance between the second zones so small that the depletion regions of adjacent first zones associated with the pn junctions meet each other before the breakdown voltage is reached. As a result, the equipotential lines will also have a less strongly curved form. Thus, the operating voltage defines an upper limit for the distance between the first outer edges of adjacent first zones.

If the mutual distance between the first zones is chosen so that no breakdown will occur in situ, the breakdown voltage will mostly be determined by the breakdown occurring at the outer edge of the overall pattern of first zones. It is also known from the aforementioned British Patent Application No. 2,087,648 to surround the overall pattern of the first zones by a zone of the second conductivity type having a closed geometry. This zone, which is not provided with an electrical connection, is at a certain distance from the overall pattern of first zones, but is located inside the depletion region associated with the pn junctions of the outer first zones. This floating zone of the second conductivity type serves in known manner inter alia to prevent breakdown at the semiconductor surface. The voltage applied in the reverse direction between the first zones and the semiconductor region is distributed along the major surface between the pn junction limiting the first zone and the pn-junction which forms the outer edge of the floating zone. The floating zone assumes a potential at which the said outer edge is biased in the reverse direction.

SUMMARY OF THE INVENTION

The present invention has for its object to further improve the described semiconductor devices having regularly-arranged substructures. It is based inter alia on the recognition of the fact that the described compromise between breakdown voltage and series resistance, which is determinative of the mutual distance between the substructures, can be favorably changed by imnproving the electrical field distribution in the semiconductor body and that this improved field distribution can be obtained substantially without additional area being required at the major surface and without additional processing steps becoming necessary during manufacture.

According to the invention, a semiconductor device of the kind described above is characterized in that further surface zones of the second conductivity type are present at the major surface in the grid-shaped part at the area of intermediate spaces enclosed by three or more first zones, the conductive layer being provided above the further surface zones with further openings, whose size corresponds to the lateral extent of the further surface zones, in which the further surface zones, in contrast with the first zones, are free from a zone of the first conductivity type located inside the further surface zone and connected to this further surface zone.

With a regular arrangement of regular substructures, intermediate spaces are enclosed between three or more substructures, in which the distance measured along the major surface from the closest outer edge of the closest first zone is larger than half the shortest distance between the first outer edges of two adjacent first zones. When these intermediate spaces are filled entirely or in part with further surface zones of the second conductivity type, the field distribution in the semiconductor body is improved and this distribution is a closer approximation of the distribution associated with a plane pn junction having the size of the area occupied by the overall pattern of substructures. As a result, the breakdown voltage is increased or, with unchanged breakdown voltage, a larger distance between two adjacent substructures may be used so that the series resistance is reduced.

A great advantage is that no additional processing steps are required during manufacture for the further surface zones of the second conductivity type. These zones may be obtained simultaneously with the first zones or, if the first zones are each applied in two or more steps, during one of these steps, As far as the gate electrode is used as a doping mask for providing (a part of) the first zones, this gate electrode may also be utilized as a doping mask for the further surface zones of the second conductivity type.

It is further of importance that the intermediate spaces are too small to receive a complete transistor substructure with interconnected first and second zones. According to the invention, these intermediate spaces accommodate other and generally smaller semiconductor structures, which do not have the shortcircuited pn junction of the transistor substructures and by which the field districution is improved, while these other different structures can be provided without additional processing steps.

A preferred embodiment of the semiconductor device according to the invention, which has a second zone which, viewed on the major surface, leaves free a central part of the first zone adjoining the major surface, is further characterized in that the further surface zones, viewed on the major surface, have at least approximately the same size as the central part of the first zone.

The present invention is especially advantageous in devices in which there is present at the center of the opening in the conductive layer serving as a gate electrode a centrally-arranged opening in the insulating layer, in which a second conductive layer adjoins and is connected to the central part of the first zone and to the second zone, the shortest distance between two adjacent openings in the first conductive layer serving as a gate electrode located above the first zones being larger than a characteristic cross-section of the said opening in the insulating layer. In fact, particularly in structures in which a comparatively large mutual distance is used in connection with the series resistance, the risk of breakdown between the substructures occurs, while at the same time the intermediate spaces are generally sufficiently large to accommodate in accordance with the invention a further surface zone.

The first zones preferably have, viewed on the major surface, the form of a regular polygon and the further openings in the first conductive layer serving as a gate electrode have a form substantially complementary to the pattern of surrounding polygons. Thus, the area at which the risk of the occurrence of breakdown is a maximum is filled to the highest possible degree.

Satisfactory results were obtained with devices according to the invention, in which the further openings in the first conductive layer serving as a gate electrode have a characteristic cross-section or dimension (feature size) which is smaller than the shortest distance between two adjacent openings in this first conductive layer located above the first zones.

In a further preferred embodiment of the device according to the invention, the further surface zone is free from an electrical connection located at the major surface. This embodiment is characterized in that the whole part of the major surface located inside the edge of the further opening is covered with an insulating layer.

The other semiconductor structure arranged in the intermediate spaces preferably comprises only a semiconductor zone of the second conductivity type. Such a device according to the invention is further characterized in that the further surface zone is free from a zone of the first conductivity type located inside this further surface zone. In such a semiconductor structure arranged in the intermediate spaces, there is only a small risk of the occurrence of bipolar transistor effects.

BRIEF DESCRIPTION OF THE DRAWINGS

The invention will now be described more fully with reference to several embodiments and the acompanying diagrammatic drawing, in which.

DESCRIPTION OF THE PREFERRED EMBODIMENTS

Figure 1:
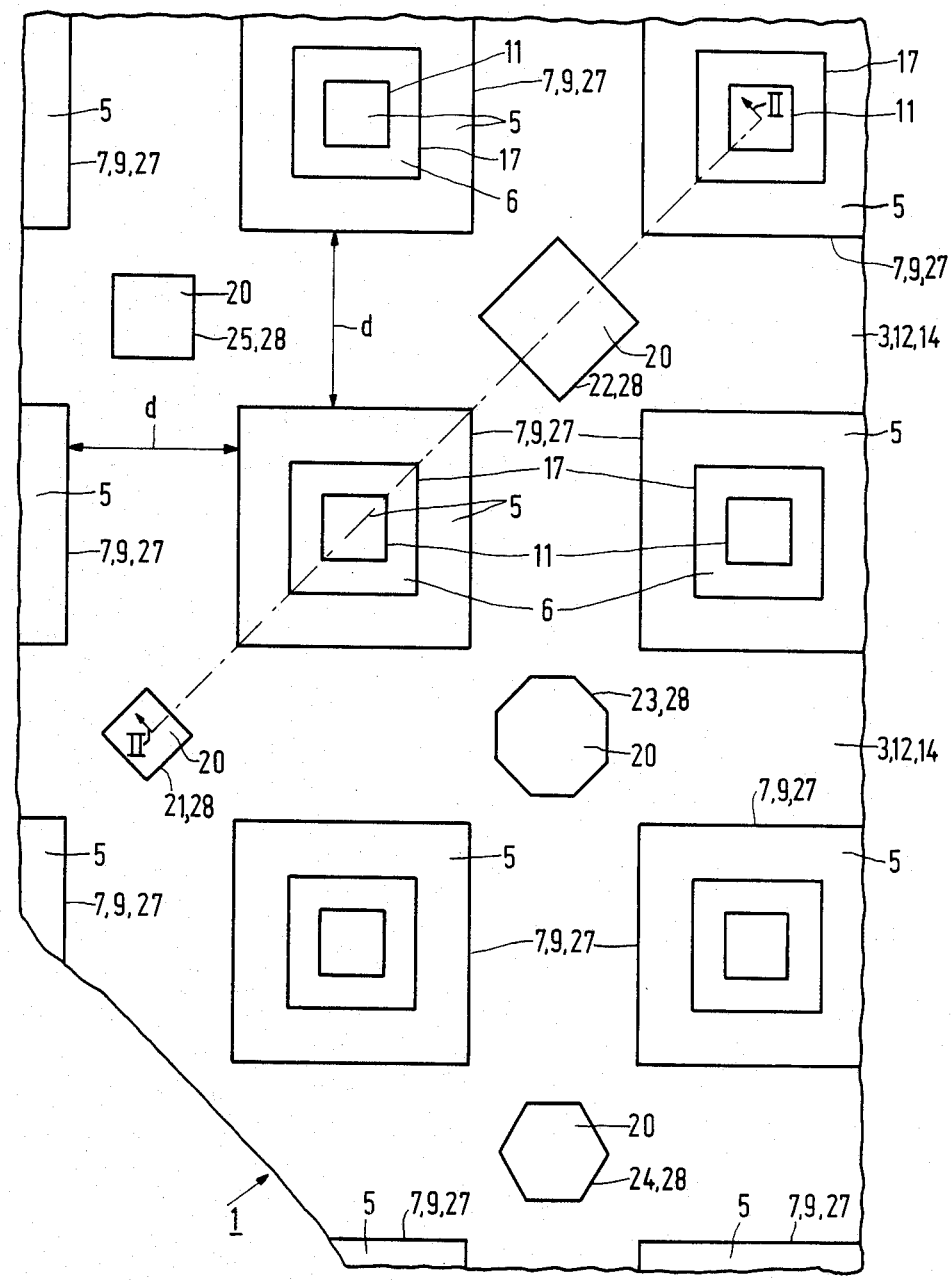
FIG. 1 is a part of a plan view of a first embodiment of the semiconductor device according to the invention.

The first embodiment relates to an integrated circuit comprising a field effect transistor, a part of which is shown diagrammatically in plan view in FIG. 1. This semiconductor device comprises a semiconductor body 1 having a major surface 2 (FIG. 2) which is adjoined by a comparatively weakly-doped semiconductor region 3 of the first conductivity type.

The semiconductor body 1 has a construction usual for integrated circuits with a substrate 4, which is, for example, a p-type silicon carrier or support on which an n-type epitaxial layer is formed. This epitaxial layer is subdivided in a usual manner, for example by means of p-type separation zones or of grooves or of regions of insulating material sunk for at least part of their thickness into the semiconductor body, into mutually separated regions or islands, which islands are electrically isolated from each other at least during operation of the semiconductor device. One of the said islands is the semiconductor region 3 shown.

The major surface 2 is adjoined by several first zones 5 of a second conductivity type opposite to the first conductivity type regularly arranged with respect to each other, which first zones 5 extend from the major surface 2 down to a smaller depth in the semiconductor body 1 than the semiconductor region 3.

In the present embodiment, the zones 5 are p-type zones. A comparatively highly-doped second zone 6 of the first conductivity type is present inside each of these first zones 5. The n-type zones 6 are separated in the semiconductor body 1 by the first zones 5 from the semiconductor region 3.

Each first zone 5 has a first outer edge 7, which is formed by the end of the pn junction 8 between the relevant first zone 5 and the semiconductor region 3 emerging at the major surface 2.

Each second zone 6 has a second outer edge 9, which is formed by an end of the pn junction 10 between the relevant second zone 6 and the adjoining first zone 5 emerging at the main surface 2.

The second zones 6 have a closed geometry, which is limited on the inner side by an inner edge 11, which is also formed by an end of the pn junction 10 emerging at the main surface. Inside the inner edge 11, the first zone 5 adjoins the major surface 2.

The second outer edge 9 is located, viewed on the major surface 2, inside the first outer edge 7, the first and second outer edges 7 and 9, respectively, having a substantially equal relative distance substantially throughout their lengths.

The inner edge 11 also follows the two outer edges 7 and 9 at a constant distance. This is not necessary, however. The inner edge 11 may, if desired, also have a different geometry deviating from that of the outer edges 7 and 9.

Each second zone 6 is connected to the adjoining first zone 5 through the conductive layer 16.

The first zones 5 are separated at the major surface 2 from each other by a substantially symmetrical grid-shaped part 12 of the semiconductor region 3. This symmetrical grid-shaped form is due to the regular arrangement of the regularly-formed first zones 5.

The grid-shaped part 12 is covered at the major surface 2 with an insulating layer 13, 15, which extends beyond the first outer edge 7 and at least as far as the second outer edge 9. There is present on the insulating layer 13 a conductive layer which serves as a gate electrode 13 a conductive layer which serves as a gate electrode 14 and entirely covers the surface part of the major surface 2 occupied by the grid-shaped part 12. The conductive layer 14 has openings, whose edge 27 is indicated and which have a size corresponding to the lateral extent of the first zones 5 located beneath these openings 27 in the semiconductor body 1. The lateral extent in this case is the extent in lateral direction, i.e. in the direction substantially parallel to the major surface 2. In practice, the first outer edge 7 of the first zone 5 is an image of the edge 27 of the opening in the conductive layer 14.

The insulating layer 15 covers the gate electrode 14. A second conductive layer 16 insulated from the gate electrode 14 is connected at the major surface 2 in the central part of each substructure limited by one of the first zones 5 to each of the first and second zones 5 and 6, respectively. For this purpose, contact windows each limited by an edge 17 are present in the insulating layer or insulating layers located on the major surface 2. In each of these contact windows 17 located at the center of the opening 27 in the conductive layer 14 serving as a gate electrode, the second conductive layer 16 adjoins and is electrically connected to the first zone 5 and the second zone 6. For the sake of clarity, the conductive layer 16 is not shown in FIG. 1. For the same reason, the second outer edge 9 and the edges 27 of the gate electrode 14, which are located at a comparatively small distance from the first outer edge 7, are indicated together with the first outer edge 7 by a single line 7,9,27 in FIG. 1.

The field effect transistor of the device has a drain which is constituted by the semiconductor region 3. This semiconductor region has a more highly doped part in the form of a buried layer 18 of the one conductivity type, which extends at and near the interface between the epitaxial layer and the substrate 4. At the edge of the island 3, an electrical connection (not shown) for the island 3 may be provided at the major surface 2 beside the collection of substructures 5,6 in a usual manner. This electrical connection may comprise an electrical contact connection formed simultaneously with the conductive layer 16 and a more highly doped n-type contact zone. The conductive contact connection, the contact zone and the buried layer 18 together constitute a good conducting contact connection for the drain zone 3.

The source zone of the field effect transistor is formed by the second zones 6, which are interconnected by means of the conductive layer 16. The conductive layer 16 forms the conductive contact connection of the source zone. This conductive layer 16 is also connected to the first zones 5 in order to prevent bipolar transistor effects from occurring. When the first zones 5 are not connected, the second zones 6, the first zones 5 and the semiconductor region 3 constitute a bipolar transistor having a floating base, which, as known, may exhibit breakdown at comparatively low operating voltages. In this connection, it is further also of importance that the series resistance in the first zones 5 is sufficiently small so that a current, if any, can flow away to the conductive layer 16 without a considerable voltage gradient occurring in the first zones 5. Consequently, a shortcircuit of the pn junction 10 at the center of the substructures 5,6 contributes considerably to a favorable electrical behavior of the transistor.

The gate electrode 14 may consist of a suitable conductive material, such as polycrystalline or amorphous semiconductor material, molybdenum or another suitable conductor and/or a suitable silicide. For the electrical connection, use may be made of a conductor pattern (not shown) which is formed simultaneously with the conductive layer 16 and is situated at the edge of the transistor and/or in one or more recesses in the conductive layer 16 and is connected through one or more openings (not shown) in the insulating layer 15 to the gate electrode 14. The conductor pattern connected to the gate electrode 14 may have, for example, one or more fingers wihch are located for the major part above the grid-shaped part 12 and form together with the conductive layer 16 an interdigital configuration.

The channel region 19 of the field effect transistor is located between the first and second outer edges 7 and 9, respectively. In this region 19, during operation a channel for current passage between the source zone 6 and the drain zone 3 controlled by the gate electrode 14 can be obtained near the major surface 2.

The field effect transistor comprises a number of regularly-arranged substructures 5,6 in a drain zone 3 common to these substructures 5,6. In this manner, a comparatively large channel width can be obtained in a limited part of the surface area of the major surface 2. The overall channel width is substantially equal to the sum of the circumferences of the substructures 5,6. The channel length of the field effect transistor to the contrary is small and substantially equal to the distance between the first and second outer edges 7 and 9, respectively. This channel length is typically smaller than 5 μm. In the present embodiment, the channel length is about 1 to 2 μm.

The size of each of the substructures 5,6 is determined to a large extent by their structural composition and the techniques and processes used in their manufacture. The inner edge 11 of the second zone 6 is chosen, for example, so that the central part of the first zone 5 can still be masked satisfactorily during the provision of the doping for the second zone 6. This smallest mask part used in the manufacture in the present embodiment is a square having sids of about 6 μm. The contact window limited by the edge 17 and located at the center of the opening 27 has then to surround the inner edge 11 with such a clearance space that a good electrical contact of the conductive layer 16 with the first and the second zone 5 and 6, respectively, is ensured, even if the mask for this contact window is not quite correctly aligned with respect to the inner edge 11. In the embodiment, this contact window has sides of 12 μm. Further, the edge 27 of the gate electrode 14 is located at a safe distance of about 5 μm from the edge 17 of the contact window.

Also in this situation, the accuracy with which the various masks are aligned has to be taken into account. It has to be ensured that the conductive layer 16 cannot be in connection with the gate electrode 14.

The openings 27 which are provided in the gate electrode 14 and in which the substructures 5,6 are arranged, in this embodiment consequently have sides of about 22 μm, while the smallest dimension used in the photolithographic steps is about 6 μm.

The number of substructures 5,6 per unit surface area that can be realized is further determined by the relative distance d of the substructures 5,6. The chosen value of the distance d is in practice a compromise which especially depends upon the desired high breakdown voltage of the pn junctions 8 between the first zones 5 and the drain zone 3 and the desired low series resistance in the drain zone 3.

The series resistance in the drain zone is determined to a large extent by the spreading resistance met by the current in the comparatively weakly-doped part of the semiconductor region 3 between the major surface 2 at which the channel of the field effect transistor is located and the buried layer 18. In addition, with larger currents this series resistance can increase considerably because then due to the larger voltage gradient the reverse voltage across the pn junctions 8 increases and consequently the depletion layers associated with these junctions 8 becomes larger. This means that for a low series resistance the distance d must not be chosen too small.

For a high breakdown voltage of the pn junctions 8, not only the doping concentrations in the first zone 5 and the semiconductor region 3, but inter alia also the quality of the interface between the semiconductor region 3 and the overlying insulating layer, the quantity of charge incorporated in this insulating layer and the curvature of the pn junctions 8 near the outer edges 7 are of importance. In order to avoid breakdown at the semiconductor surface and/or breakdown due to the curvature of the pn junctions 8, the substructures 5,6 are arranged at such a small mutual distance d that the two depletion regions associated with the pn junctions 8 meet each other in a lateral direction with increasing reverse voltage across the pn junctions 8 before breakdown of the pn junctions 8 occurs.

According to the invention, further surface zones 20 of the second conductivity type are present at the major surface 2 in the grid-shaped part 12 at the area of intermediate spaces enclosed by three or more first zones 5, further openings indicated by their edge 28 being present in the conductive layer 14 above the further surface zones 20. The size of the further openings 28 corresponds to the lateral extent of the further surface zones 20. Furthermore, the further surface zones 20 are, in contrast with the first zones 5, free from a zone of the first conductivity type located inside the further surface zone 20 and connected to this further surface zone 20.

The p-type further surface zones 20 form a pn junction 29 with the semiconductor region 3, which is indicated in the plan view of FIG. 1 by the same line as the edge 28 of the further openings in the gate electrode 14. In fact, the end of the pn junction 29 located at the major surface 2 forms an image of the edge 28.

Even if the zones 20 are not provided with an electrical connection, they assist in providing for the equipotential lines in the depleted part of the semiconductor region 3 a more plane, less strongly curved form, as a result of which breakdown of the pn junctions 8 occurs less rapidly. If the p-type zones are electrically floating, substantially no reverse voltage is produced across the pn junctions 29. The floating further surface zones 20 will assume a potential which is approximately equal to the potential which occurs at those parts of the pn junctions 29 which are closest to the pn junctions 8 in the semiconductor region 3.

In practice it has been found that in many patterns of regular substructures 5,6 the mutual distance d between two adjacent substructures 5,6 is sufficiently large or can be enlarged sufficiently by the use of further surface zones 20 to ensure that in the intermediate spaces enclosed by three or more of the substructures 5,6 a surface zone 20 can be arranged, whose size corresponds to the smallest subpattern which is used in each of the substructures 5,6. In the present embodiment, the smallest subpattern is the central part of the first zone 5, which is limited by the inner edge 11. A similar square having sides of about 6 μm can be realized in the intermediate spaces between four square substructures 5,6 in such a manner that it does not extend at any point to less than a distance of 6 μm from the surrounding substructures 5,6 if the distance d is not smaller than about 12.75 μm. This square is then situated with respect to the substructures 5,6 in a manner shown in FIG. 1 by the square 21.

In this embodiment, the distance d is about 16 μm, as a result of which even a square 22 having sides of 10 to 11 μm can be arranged in the intermediate spaces. Also other forms, such as the regular octagon 23, the regular hexagon 24 or the square 25 having sides of about 7.5 μm arranged so as not to be rotated with respect to the substructures 5,6, may be utilized.

The form and the position of the further surface zones 20 are preferably chosen so that the intermediate space enclosing all the points at the major surface 2 which are located at a distance larger than d/2 from each of the surrounding substructures 5,6, is filled to the highest possible degree. However, the mask openings used for providing the surface zones 20 should then be located at all points at least at the minimum distance from the surrounding substructures 5,6 mostly determined by the photolithographic techniques used. Generally, this smallest mask dimension will also be used in that part of the mask which masks the central part of the first zone 5 during the provision of the doping of the second zones 6.

The form of the edge 28 of the further openings and of the further surface zones 20 is preferably approximately complementary to the pattern of openings 27 and of substructures 5,6. This means that the aforementioned intermediate space is approached by an opening limited by substantially straight line parts. In the embodiment shown in FIG. 1, the complementary form of the regularly-arranged square openings 27 is a square which is rotated with respect to the openings 27 through an angle of 45°. The squares 21 and 22 of FIG. 1 consequently have the complementary form.

With a regular arrangement of square openings 27, in which the squares arranged in a row are displaced through a distance equal to half the length of the sides of the squares plus half the mutual distance d in the direction of the row with respect to the squares in the adjacent row, the complementary form is triangular.

Figure 3:
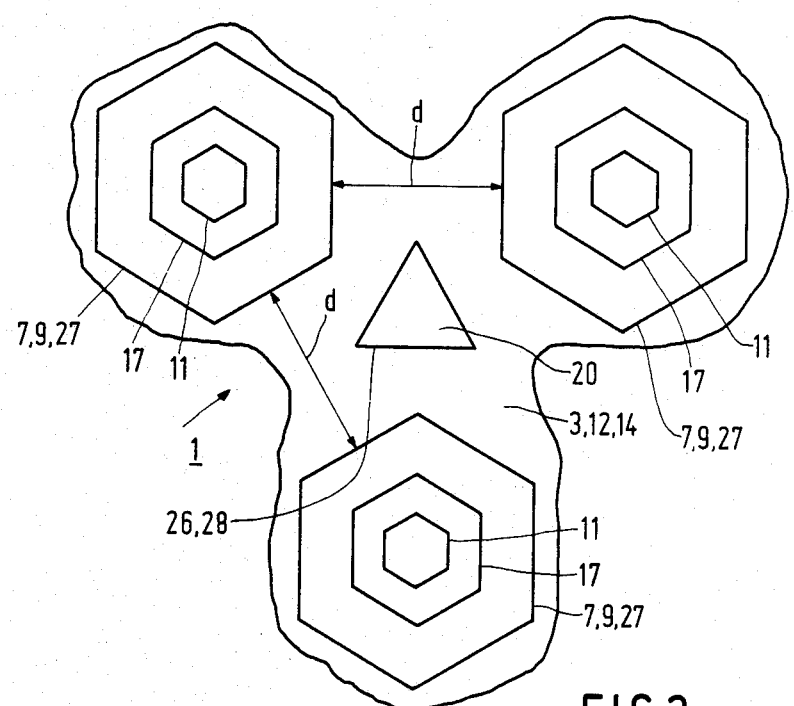
FIG. 3 is a part of a plan view of a second embodiment of the semiconductor device according to the invention.

In hexagonal substructures 5,6, as used in the second embodiment, a part of which is shown in FIG. 3, the complementary form is also triangular. The p-type further surface zone 20 is indicated by a triangle 26 having sides of about 11 μm. Otherwise, the same reference numerals are used in FIG. 3 as in FIG. 1. In the hexagonal central part of the substructures 5,6, which is practically limited by the inner edge 11, the distance between two oppositely-arranged parallel sides is about 6 μm. The shortest distance between parallel sides of the hexagons 11 and 17 is about 3 μm and the corresponding distance between the hexagons 17 and 27 is about 5 μm. The shortest distance between two adjacent openings 27 is in this embodiment about 16 μm.

Figure 2:
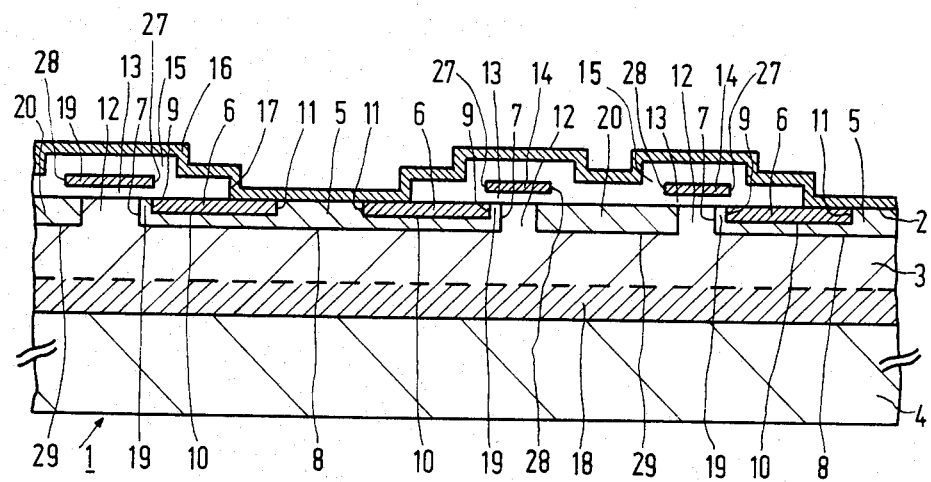
FIG. 2 shows diagrammatically and not to scale a sectional view of this embodiment taken on the line II—II of FIG. 1.

Apart from the geometrical form, the structural composition of the embodiment of FIG. 3 is equivalent to that of the embodiment of FIGS. 1 and 2.

For the sake of completeness it should be noted that the numerical values of dimensions mentioned above by way of example relating to the suitable patterns are mask dimensions. The corresponding dimensions in the actual semiconductor device may deviate slightly inter alia due to the occurrence of under-etching and/or of lateral diffusion. Furthermore, the minimum dimension in the patterns used still considered to be permissible may depend upon the form of the relevant detail. If a square opening or a square spot has minimum sides of 6 μm, for example, often rectangular details of about 4 μm × 10 μm will be permissible in addition. Both details match and may be used together with a shortest distance between adjacent openings in the gate electrode of about 6 μm. With the use of the same methods, the smallest regular octagon may have, for example, a distance of about 7 μm between its parallel sides. Mostly, the openings used can be characterized by a dimension which is connected with the distance between oppositely-arranged sides of the opening. With a square opening, this characteristic cross-section is equal to the length of the sides and, for example, in the case of a rectangle approximately equal to the length of the sides of a square which approximately has the same surface area as the rectangle.

It is inter alia of importance within the scope of the invention that the edges of the substructures and the edges of the further surface zones 20 are all determined by openings 27 and 28 in the gate electrode 14. These openings are obtained during the same processing step and with the same mask. Therefore, the shortest distance between the substructures 5,6 and the further surface zones 20 can be equal to the aforementioned minimum distance and a possible variation in this shortest distance, which could be produced otherwise due to the non-ideal alignment of the various masks to be used during the manufacture, need not be taken into account in this case.

Preferably, each of the openings 28 in the gate electrode 14 located above the further surface zones 20 has at least approximately the same size as the central part of the substructures 5,6, as is the case with the squares 11 and 21, and these openings 28 are at most so large that the distances between each of these openings 28 and the edges 27 of the gate electrode 14 surrounding the adjacent substructures 5,6 correspond at least to a characteristic smallest dimension—mostly a cross-section which is characteristic of the central part of the substructures 5,6.

Mostly, the substructures 5,6 will be equal to each other and will have the form of a regular polygon. However, other topographic forms are also possible.

The further surface zones 20 substantially do not occupy additional area at the major surface 2 because these zones can be comparatively small surface zones which fit into the intermediate spaces enclosed by the substructures 5,6. In fact, if required, the surface zones 20 may have the minimum size which can be realized with the techniques used in manufacture. In this connection, it is of importance that the further surface zones 20 need not be provided with an electrical connection located at the major surface 2 so that no contact window need be provided above the surface zones 20. It is sufficient to provide a doping window. Preferably, the further openings 28 in the layer 14 serving as a gate electrode have a characteristic cross-section, which is smaller than the shortest distance d between two adjacent openings 27 in this conductive layer 14 located above the first zones 5. In the embodiment of FIG. 1, the largest openings 28, the square 22 and the octagon 23 have a characteristic cross-section of about 11 $\mu$m, while the distance d is about 16 $\mu$m.

Dependent upon the method used, only doping impurities for obtaining the second conductivity type may be provided through this doping window, or further doping impurities for obtaining the first conductivity type may be provided simultaneously with the formation of the second zones 6 in the surface zones 20. The whole part of the major surface 2 located inside the edge 28 of the further opening in the conductive layer 14 is preferably covered with an insulating layer 15, which, for example, separates in situ the conductive layer 16 from this part of the major surface 2.

In connection with the desired low series resistance, the largest distance d between two adjacent openings 27 located above the first zones 5 and provided in the conductive layer 14 serving as a gate electrode is larger than a characteristic cross-section of the centrally located opening 17 in the insulating layer 15 present at the center of the opening 27, in which opening 17 a second conductive layer 16 adjoins and is connected to the central part of the first zone 5 and to the second zone 6. In the embodiment of FIG. 1, the distance d is about 16 $\mu$m and the square opening 17 has a characteristic cross-section of about 12 $\mu$m.

It is of importance for the satisfactory operation of the transistor that the intermediate spaces are occupied entirely or in part by a semiconductor structure which forms a pn junction 29 with the semiconductor region 3 so that the depletion regions associated with the pn junctions 8 are intercepted and unite with each other. Thus, a better electrical field distribution is obtained with which the equipotential lines have a less strongly curved form and their form corresponds more accurately with the form which is found with a plane pn junction not consisting of mutally separated parts.

Due to the improved electrical field distribution, the aforementioned compromise determining the relative distance d is shifted in favorable direction. Breakdown of the pn junctions 8 occurring at the area of the intermediate spaces can be avoided.

In practice, this will mostly result in breakdown of the pn junctions 8 first occurring at the edge of the pattern of substructures 5,6. In order to avoid this edge of the pattern having an irregular form determined by the outermost substructures 5,6, the pattern of substructures is often surrounded by an annular substructure which on its inner side acts as a transistor and follows as accurately as possible the irregular edge of the pattern of substructures 5,6. Along this inner side, the annular substructure then adjoins the gate electrode 14, while along this inner side also an annular second zone 6 is present in the annular first zone 5. The outer side of the annular substructure may have a more strongly rounded form, in which event no second zone 6 is formed along this outer side so that here the conductive layer 16 may be connected to this substructure 5,6.

If desired, any intermediate spaces between the pattern of regular substructures and the annular substructure finishing this pattern may also be filled with further surface zones 20.

As far as breakdown of the pn junction 8 at the more strongly rounded outer side of the described annular substructure has to be suppressed more strongly, for example, an annular more weakly-doped region of the second conductivity type may be used, which directly adjoins and passes into the first zone 5 of the annular substructure, and/or one or more rings of the second conductivity type, which are electrically not connected, may be formed at the major surface 2 at a certain distance from the annular substructure in the semiconductor region 3. Such annular floating regions, which surround a surface zone at a certain distance, may take up, as known, a part of the reverse voltage applied to the pn junction limiting the surface zone in such a manner that no breakdown occurs along the semiconductor surface or this breakdown is reached only at a higher reverse voltage.

The semiconductor devices described may be manufactured, for example, as follows. At a major surface of a p-type silicon substrate having a resistivity of, for example, about 30 to 40$\Omega$.cm, doping impurities for one or more buried layers 18 are provided in a usual manner. This impurity may be, for example, Sb with a dose of about $3.10^{15}$ atoms/cm$^2$. Subsequently, an n-type epitaxial layer having a thickness of about 20 $\mu$m and a resistivity of about 5$\Omega$.cm is providd on the said major surface. This epitaxial layer is subdivided in a usual manner, for example by means of a p-type separation diffusion, into mutually separated islands. If required, deep, more highly-doped n-type contact zones can be provided in the islands, which contact zones preferably extend from the free major surface of the epitaxial layer substantially as far as or into the buried layer.

The semiconductor body of conventional construction thus obtained serves as a starting member for the further processing steps, by which switching elements required for the integrated circuit are formed in the islands.

The semiconductor device according to the invention need not be an integrated circuit and may also have, for example, the form of a single power transistor. In this case, instead of the semiconductor body described above, a body consisting of a highly doped n-type substrate provided with the described n-type epitaxial layer may be used. The processing steps for obtaining p-type separation zones and deep n-type contact zones are then not necessary.

The free surface of the epitaxial layer constitutes the major surface of the device ultimately to be obtained. Now all oxide is removed at least from that part of this major surface which is intended for the field effect transistor. A clean oxide layer is then applied by thermal oxidation. This oxide layer may have a thickness of about 100 nm. To this oxide layer is applied a layer of polycrystalline silicon having a thickness of about 0.5 $\mu$m. This silicon layer may be doped with phosphorous in a usual manner during or after its deposition. The gate electrode 14 is obtained from this silicon layer. For this purpose, for example, a masking layer consisting of a usual photolacquer in which the pattern desired for the gate electrode is imaged. According to the invention, this pattern comprises, beside first openings 27 which will be occupied by the substructures 5,6, also smaller further or second openings 28 which will be occupied by the further surface zones 20. The first openings 27 are regularly arranged and the second openings 28 are located in the intermediate spaces enclosed by three or more first openings 27. After application of this pattern, an etching treatment is carried out, in which the excess parts of the silicon layer are removed and, at least as far as the field effect transistor is concerned, only the gate electrode 14 is left. The parts of the thin oxide layer not covered by the gate electrode 14 are also removed so that only the parts 13 of this oxide layer are left.

If desired, at this stage of the manufacture, boron may be implanted with the use of a photolacquer mask for the aforementioned comparatively weakly-doped region which adjoins on the outer side the annular substructure and serves there for increasing the breakdown voltage. This weakly doped region may have, for example, a sheet resistance of 8 to 12 k$\Omega$ per square. Subsequently, a new photolacquer mask is provided having an opening of the size of the whole field effect transistor. This mask serves for limiting the outer edge of the first zone 5 of the annular substructure 5, 6 not shown. Through this opening, boron for the first zones 5 and for the further surface zones 20 is implanted into the semiconductor body, whereby besides the photolacquer mask also the gate electrode 14 serves as a mask for this doping treatment. The dose is, for example, about $10^{14}$ atoms/cm$^2$ and the sheet resistance of the doped semiconductor zones 5 and 20 obtained is, for example, about 300 $\Omega$ per square.

A new photolacquer mask is then provided, which covers the central part of each first zone 5. Consequently, at the center of each substructure an approximately square photolacquer region having sides of about 6 nm is provided. The part of the surface located outside of the annular second zone 6 of the annular substructure 5,6 also remains covered with photolacquer. Preferably, but not necessarily, the second openings in the gate electrode 14 are also covered with photolacquer. Subsequently, phosphor is implanted at a dose of, for example, about $5.10^{15}$ atoms/cm$^2$. This doping serves to form the second zones 6, whereby the inner edge 11 is determined by the photolacquer mask and the second outer edge 9 is determined by the same edge 27 of the gate electrode 14 with which the first outer edge 7 of the first zones 5 was also defined. After the implantation treatment, the lacquer pattern can be removed.

It is usual that after each implantation treatment or after a number of implantation treatments a treatment at elevated temperature is carried out, during which the implanted impurities diffuse more deeply into the semiconductor body 1. Frequently, such diffusion treatments are carried out in an oxidizing atmosphere. In the present embodiment, after these treatments a structure was obtained in which the pn junction 8 was located about 3 $\mu$m and the pn junction 10 was located about 1 $\mu$m below the major surface 2.

After termination of all the treatments at elevated temperature, it was found that the buried layer extended to a distance of about 7 $\mu$m from the interface between the substrate 4 and the epitaxial layer into the epitaxial layer. The remaining thickness of the comparatively weakly-doped region 3 was still about 13 $\mu$m, measured from the major surface 2.

Subsequently, an insulating layer 15 of silicon oxide having a thickness of about 0.8 $\mu$m can be deposited.

In order to complete the semiconductor device, for example, a silicon nitride layer having a thickness of about 80 nm and a silicon oxide layer having a thickness of about 2.5 $\mu$m may be applied to the insulating layer 15. This double layer is not shown in the figures.

By means of a mask, a large opening substantially comprising the whole region occupied by the transistor is etched into the double layer of silicon oxide and silicon nitride. The edge of this opening is located, for example, above the aforementioned annular more weakly-doped p-type region tightly surrounding the transistor in order to increase the breakdown voltage.

Subsequently, the last-mentioned lacquer mask is removed and is replaced by a lacquer mask provided with openings for the contact windows, which are indicated by their edges 17. Further, this lacquer mask has one or more openings which are located above the gate electrode 14. After the windows have been etched into the insulating layer 15 and the lacquer pattern has been removed, a conductive layer may be applied, which may consist, for example, of aluminum containing 1% of silicon and may have a thickness of about 2 $\mu$m. By etching, the conductive layer 16, the connection (not shown) for the gate electrode and the electrical connection (not shown) for the island 3 are obtained from this conductive layer.

If desired, there may additionally be applied to the structure thus obtained a protective layer (not shown) of, for example, silicon nitride, in which openings are provided at suitable areas in order to be able to connect electrically the semiconductor device, for example, to parts of a usual envelope.

It will be appreciated that the present invention is not limited to the embodiments described, but that many variations are possible for those skilled in the art without departing from the scope of the invention. For example, instead of the said silicon, other semiconductor materials, such as germanium or $A^{III}$-$B^V$ compounds may be used. As the material for the insulating layers, instead of the said silicon oxide, silicon nitride or silicon oxynitride or aluminum oxide may also be used. Instead of deposition, the insulating layer 15 may alternatively be obtained by thermal growth if this is taken into account when the polycrystalline silicon layer 14 is applied. This layer must have a slightly larger thickness because a part of this layer is converted into oxide in the case of thermal growth. Further, the said conductivity types may be interchanged.

The second zones 5 may have an edge region doped in the indicated manner adjoining a more highly doped central part. Thus, the series resistance in the second zones 5 may be decreased, as a result of which the possibility of vertical bipolar transistor effects is reduced. In this case, a further doping treatment is required for the more highly-doped central part.

By the processing steps described and, if required, also by further processing steps not stated here, other usual circuit elements, such as bipolar transistors, resistors and capacitances, may be formed in the remaining part (not shown) of the device.

The field distribution in the semiconductor body 1 may, if required, be improved by conducting electrodes which are located on an insulating layer and are connected to a point of suitable potential of the semiconductor device.

Furthermore, the further surface zones 20 may be connected locally to the second zones 6 by lateral diffusion if the first and second openings 27 and 28 in the gate electrode 14 are located at the shortest possible mutual distance. Although the further surface zones 20 are then no longer electrically floating, such a connection does not negate the favorable effect of the further surface zones 20 on the electrical field distribution in the semiconductor body 1. Furthermore, at any rate the great advantage is maintained that no additional processing steps are required during manufacture for applying the further surface zones 20, as a result of which inter alia no additional area need be destined at the major surface 2 for neutralizing inaccuracies in the alignment of masks.

If by the use of the further surface zones 20 the mutual distance of the substructures can be made so large that a contact window can be provided inside the further surface zones 20, the further surface zones 20 can also be connected to a third conductive layer. For example, the square 22 of FIG. 1 is nearly sufficiently large to provide therein a contact window of minimum dimensions. Preferably, this third conductive layer is integral with the second conductive layer 16 so that the further surface zones 20 are connected to the second zones 6. Such an electrical connection also does not unfavorably influence the envisaged effect.

Preferably, the further surface zones 20 are free from a zone of the first conductivity type located inside these surface zones although such n-type zones will not have many disadvantageous effects, especially if the transistor is used as a switch. As far as such n-type zones are present in the p-type further surface zones 20, they are preferably not provided with a connection at the major surface and the insulating layer 15 in the opening 28 is entirely closed. If the transistor is also operated at higher operating voltages in the conductive state, the bipolar transistor effects may occur in further surface zones 20 in which an n-type zone is formed. Transistors intended for such a use preferably have futher surface zones 20 which are free from a zone of the first conductivity type located inside these surface zones.

Instead of a second zone 6 having a closed geometry, a second zone 6 consisting of two or more separated parts may also be used, in which event these parts are preferably arranged so that they occupy substantially one region having a closed geometry.

What is claimed is:

1. A semiconductor device comprising a semiconductor body having a major surface, a comparatively weakly-doped semiconductor region of a first conductivity type adjoining said major surface, several first zones of a second conductivity type opposite to the first conductivity type also adjoining said major surface, said first zones being arranged at a regular distance "d" from each other and extending from the major surface down to a smaller depth in the semiconductor body than the depth of the semiconductor region, a comparatively highly-doped second zone of the first conductivity type inside each first zone which is separated in the semiconductor body by the first zone from the semiconductor region, each first zone having a first outer edge and each second zone having a second outer edge, the second outer edge, viewed on the main surface, being located inside the first outer edge and the first and the second outer edges being substantially equidistant throughout their lengths, each second zone being connected to the adjoining first zone, a substantially symmetrical grid-shaped part of the semiconductor region which separates the first zones from each other at the major surface and surrounds each of the first zones, an insulating layer for covering the grid-shaped part at the major surface, said insulating layer extending beyond the first outer edge and at least as far as the second outer edge, a conductive layer on the insulating layer which serves as a gate electrode and covers at least part of the major surface occupied by the grid-shaped part, said conductive layer having openings whose sizes correspond to the later extent of the first zones located beneath these openings in the semiconductory body, and further surface zones of the second conductivity type provided at the major surface in the grid-shaped part at intermediate spaces thereof bounded by three or more first zones, said further zones being electrically isolated from said gate electrode and filling substantially all of said intermediate spaces which are located at a distance of at least half said regular distance "d" from said first zones, and the conductive layer being provided with further openings above the further surface zones whose sizes correspond to the lateral extent of the further surface zones.

2. A semiconductor device as claimed in claim 1, characterized in that the second zone, viewed on the major surface, has a central aperture which exposes a central part of the first zone adjoining the major surface, and, viewed on the major surface, the further surface zones each have at least substantially the same size as the central part of the first zone.

3. A semiconductor device as claimed in claim 2, characterized in that the second zone, viewed on the major surface, has a closed geometry and surrounds the central part of the first zone.

4. A semiconductor device as claimed in claim 2 or 3, characterized in that a centrally-arranged opening in the insulating layer is provided at the center of said opening in the conductive layer serving as the gate electrode, in which opening a second conductive layer is provided which adjoins and is connected to the central part of the first zone and to the second zone, the shortest distance between two adjacent openings located above the first zones in the conductive layer serving as the gate electrode being larger than a cross-section of said opening in the insulating layer.

5. A semiconductor device as claimed in claim 1, 2 or 3, characterized in that the first zones, viewed on the major surface, each have the form of a regular polygon, the further openings in the conductive layer serving as the gate electrode having a form substantially complementary to the pattern of surrounding polygons.

6. A semiconductor device as claimed in claim 1, 2 or 3, characterized in that the further openings in the conductive layer serving as the gate electrode have a cross-section which is smaller than the shortest distance between two adjacent openings located above the first zones in the conductive layer.

7. A semiconductor device as claimed in claim 1, 2 or 3, characterized in that the entire part of the major surface located inside the edge of the further opening is covered with an insulating layer.

8. A semiconductor device as claimed in claim 1, 2 or 3, characterized in that the further surface zone is free from a zone of the first conductivity type located inside the further surface zone.

9. A semiconductor device as claimed in claim 7, characterized in that a surface zone of the first conductivity type surrounded in the semiconductor body by the surface zone is provided inside the further surface zone.

10. A semiconductor device as claimed in claim 8, characterized in that at the major surface inside the edge of the further opening in the layer serving as the gate electrode the further surface zone adjoins and is connected to a third conductive layer isolated from the conductive layer serving as the gate electrode.

11. A semiconductor device as claimed in claim 10, characterized in that the third conductive layer is connected to the second zones.

* * * * *

UNITED STATES PATENT AND TRADEMARK OFFICE
CERTIFICATE OF CORRECTION

PATENT NO. : 4,642,674

DATED : February 10, 1987

INVENTOR(S) : Franciscus A.C.M. Schoofs

It is certified that error appears in the above-identified patent and that said Letters Patent is hereby corrected as shown below:

Column 16, line 10, Claim 1, change "later" to --lateral--

Signed and Sealed this

Twenty-first Day of November, 1989

Attest:

JEFFREY M. SAMUELS

Attesting Officer     Acting Commissioner of Patents and Trademarks